(12) United States Patent
Vernickel et al.

(10) Patent No.: US 7,642,782 B2
(45) Date of Patent: Jan. 5, 2010

(54) ACTIVE DECOUPLING OF TRANSMITTERS IN MRI

(75) Inventors: Peter Vernickel, Hamburg (DE); Ingmar Graesslin, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/091,308

(22) PCT Filed: Oct. 3, 2006

(86) PCT No.: PCT/IB2006/053615

§ 371 (c)(1),
(2), (4) Date: Apr. 24, 2008

(87) PCT Pub. No.: WO2007/049166

PCT Pub. Date: May 3, 2007

(65) Prior Publication Data

US 2008/0258728 A1  Oct. 23, 2008

Related U.S. Application Data

(60) Provisional application No. 60/730,949, filed on Oct. 27, 2005.

(51) Int. Cl.
*G01V 3/00* (2006.01)
(52) U.S. Cl. .................... 324/322; 324/318
(58) Field of Classification Search ......... 324/300–322; 600/407–435
See application file for complete search history.

(56) References Cited

U.S. PATENT DOCUMENTS

| | | | |
|---|---|---|---|
| 5,500,592 A * | 3/1996 | Bottomley | 324/307 |
| 6,043,658 A | 3/2000 | Leussler | |
| 6,452,394 B1 * | 9/2002 | Lappalainen | 324/318 |
| 6,900,636 B2 | 5/2005 | Leussler | |
| 6,906,518 B2 | 6/2005 | Leussler | |
| 2004/0012391 A1 | 1/2004 | Vaughn, Jr. et al. | |
| 2005/0079132 A1 * | 4/2005 | Wang et al. | 424/1.11 |
| 2007/0222449 A1 * | 9/2007 | Hoult | 324/318 |

FOREIGN PATENT DOCUMENTS

WO   2006114749 A1   11/2006

OTHER PUBLICATIONS

Song X, et al.; "Digitalization Decoupling Method and its Application to the Phased Array in MRI"; Sep. 2003; Progress in Natural Science; vol. 13; pp. 683-689.

Lee R.F., et al.; "Coupling and Decoupling Theory and Its Application to the MRI Phased Array"; 2002; MRM; vol. 48; pp. 203-213.

(Continued)

*Primary Examiner*—Brij B Shrivastav

(57) ABSTRACT

A magnetic resonance imaging system includes a coupling compensation processor (70) for compensating induced magnetic coupling between n individual coil segments (38) of a coil arrangement (36). An adjusted signal determining device (74) determines an adjusted input signal for each of the n individual coil segments of the coil arrangement (36). A transmitting system (54) creates RF pulses in accordance with the determined adjusted input signals and transmits the RF pulses to corresponding coil segments such that the transmitted RF pulses compensate for coupling between the coil segments (38) in the digital domain.

19 Claims, 3 Drawing Sheets

OTHER PUBLICATIONS

Figure 1:
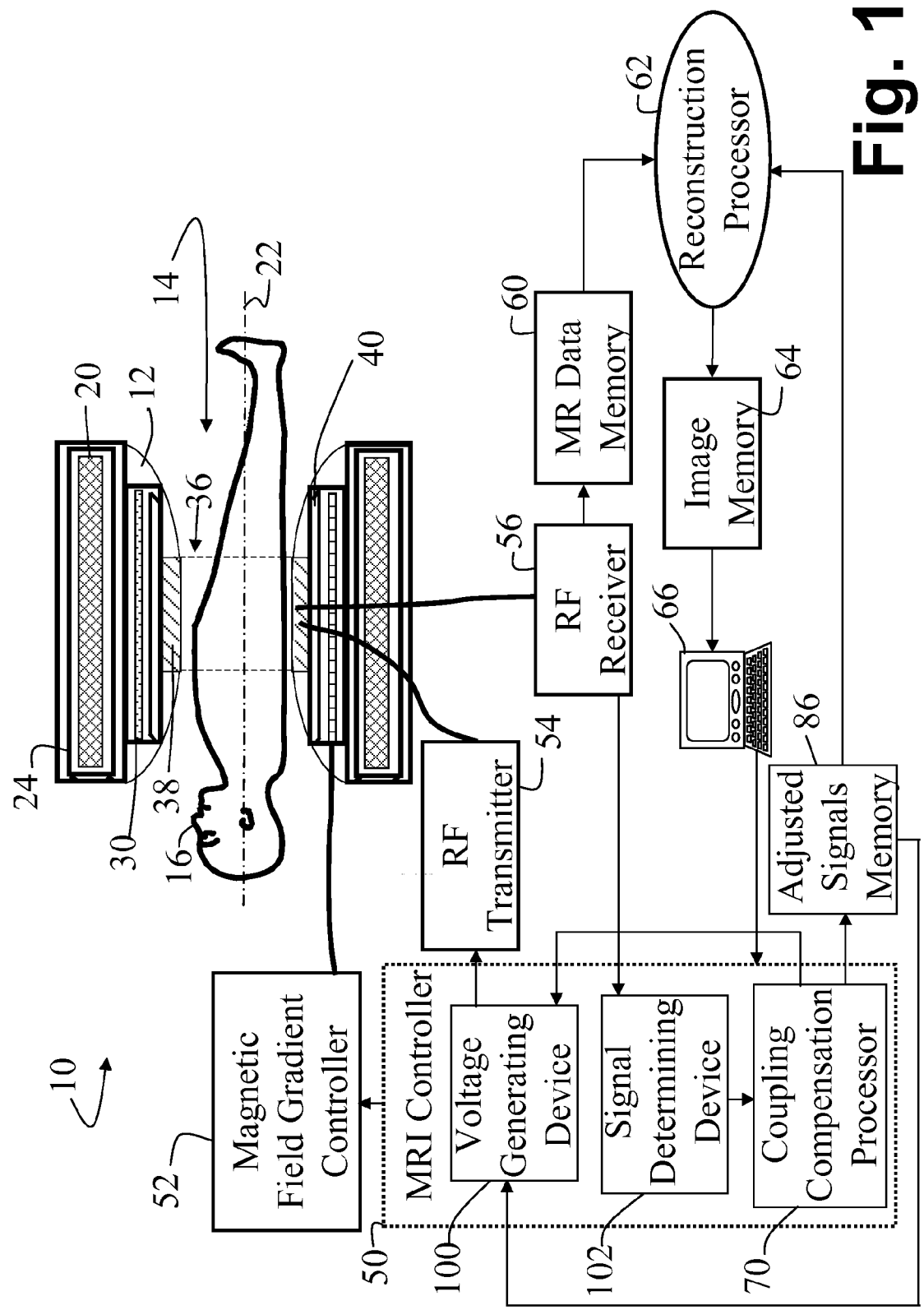

Steyskal H., et al.; "Mutual Coupling Compensation in Small Array Antennas"; Dec. 1990; IEE Transactions on Antennas and Propagation; vol. 38; pp. 1971-1975.

Pruessmann K.P., et al.; "An Investigation into the Role of Coil Coupling in Parallel Imaging"; 2002; Proc.Intl.Soc.Mag.Reson.Med.; p. 196.

Duensing G.R., et al.; "Maximizing Signal-to-Noise Ratio in the Presence of Coil Coupling";Jun. 1, 1996; J.Mag.Reson.; vol. 111, No. 3; pp. 230-235.

Segovia-Vargas D, et al.; "Mutual Coupling Effects Correction in Microstrip Arrays for Direction-of-Arrival (DOA) Estimation"; Apr. 12, 2002; IEEE Proceedings: Microwaves, Antennas and Propagation; vol. 149, No. 2; pp. 113-118.

Hoult D, et al.; Decoupling Phased Array Transmitter Coils using Cartesian Feedback; May 2005; Proc.Intl.Soc.Mag.Reson.Med.; p. 900.

Tropp J, et al.; "Feasibility of a TEM Surface Array for Parallel Imaging"; 2002; Proc.Intl.Soc.Mag.Reson.Med.; p. 856.

Ibrahim, et al., "Effect of RF Coil Excitation on Field Inhomogeneity at Ultra High Fields; A Field Optimized TEM Resonator": Dec. 2001; Magn. Reson. Imaging; 19(10); 1339-47.

Hoult, et al.; "A 'Hi-Fi' Cartsian Feedback Spectrometer for Precise Quantitation and Superior Performance"; 2004; J. Mag. Res.; pp. 57-63.

Katscher, et al.; "Transmit Sense"; Jan. 2003; Magn. Reson. Med.; 49(1); pp. 144-150.

Hoult, D. I., et al.; The NMR multi-transmit phased array: a Cartesian feedback approach; 2004; Journal of Magnetic Resonance; 171:64-70.

\* cited by examiner

ACTIVE DECOUPLING OF TRANSMITTERS IN MRI

CROSS REFERENCE TO RELATED APPLICATIONS

This application claims the benefit of U.S. provisional application Ser. No. 60/730,949 filed Oct. 27, 2005, which is incorporated herein by reference.

DESCRIPTION

The following relates to the magnetic resonance arts. It finds particular application in magnetic resonance imaging coils and scanners, and will be described with particular reference thereto. More generally, it finds application in magnetic resonance systems for imaging, spectroscopy, and so forth.

Magnetic resonance imaging (MRI) apparatus is commonly used for the examination of patients. In MRI, RF coils are used to generate $B_1$ fields within the imaging subject for exciting the nuclear spins and detecting signals from the nuclear spins.

In some multi-channel transmit/receive MRI systems, each one of a plurality of transmitting units is assigned to each RF coil or coil segment and provided for independently adjusting the amplitude and/or the phase and/or the shape of the RF waveform to be transmitted; while each one of a plurality of receiving units is assigned to each RF coil or coil segment for individually being activated or deactivated. More specifically, independent amplitudes and/or the phases and/or the shapes of the RF waveform to be transmitted are used to compensate for dielectric resonances in examination objects or to excite and optimize desired excitation pattern.

Building several RF transmitters in close proximal alignment causes mutual coupling between the elements. The phases and amplitudes of the currents in the transmitters become interrelated. Power is exchanged among the individual RF transmit channels.

One method to compensate for mutual coupling is to use passive decoupling networks. Passive decoupling methods are applicable in a useful manner for a limited number of coils since the determination of the capacitive and/or inductive elements becomes rather difficult for a large number of channels. In addition, a decoupling and matching network can only be determined and assembled for the expected standard load, which is not necessarily the actual load. At higher fields, small changes in load can have a significant effect on the decoupling of elements. Another problem in the passive decoupling networks includes the presence of parasitic capacitances and inductances of the connectors, which might cause undesired resonances.

In existing active decoupling compensation methods, mutual coupling is compensated for by properly adjusting the input signals at the ports of the multi-channel transmitter array. In the existing approach, the currents in the transmitters are adjusted using a closed loop system in the analog domain by adapting the input signals. However, the closed loop system is sensitive to load fluctuations.

The following contemplates improved apparatuses and methods that overcome the aforementioned limitations and others.

According to one aspect, a magnetic resonance imaging system is disclosed. A compensation processor compensates induced magnetic coupling between n individual coil segments of a coil arrangement. An adjusted signal determining device determines an adjusted input signal for each of the n individual coil segments of the coil arrangement. A transmitting system creates RF pulses in accordance with the determined adjusted input signal and transmits the RF pulses to corresponding coil segments such that the transmitted RF pulses compensate for coupling between the coil segments in the digital domain.

According to another aspect, a method of magnetic resonance imaging is disclosed. A desired current is determined for each of n individual coil segments of a coil arrangement which coil segments are electromagnetically coupled to each other. An adjusted input signal for application to each segment is determined, which application results in each segment carrying the desired current after coupling, to compensate for coupling between the coil segments in the digital domain. RF pulses are created in accordance with the determined adjusted input signals. The RF pulses are transmitted to corresponding coil segments.

According to another aspect, a magnetic resonance method is disclosed. A predefined RF signal is applied individually to each of a plurality of electromagnetically coupled coil elements. Induced signals, which are induced in the coil elements by the predefined signal are measured. A system matrix, which describes a relationship between the applied predefined signal and the measured induced signal, is generated.

According to another aspect, a magnetic resonance apparatus is disclosed. A main magnet generates a main field through an examination region. An RF coil system includes an array of parallel coil segments, which couple electromagnetically. An RF receiver receives resonance signals from the examination region. A coupling compensation processor compensates for coupling between the coil segments in the digital domain.

Numerous additional advantages and benefits will become apparent to those of ordinary skill in the art upon reading the following detailed description.

The invention may take form in various components and arrangements of components, and in various process operations and arrangements of process operations. The drawings are only for the purpose of illustrating preferred embodiments and are not to be construed as limiting the invention.

Figure 2:
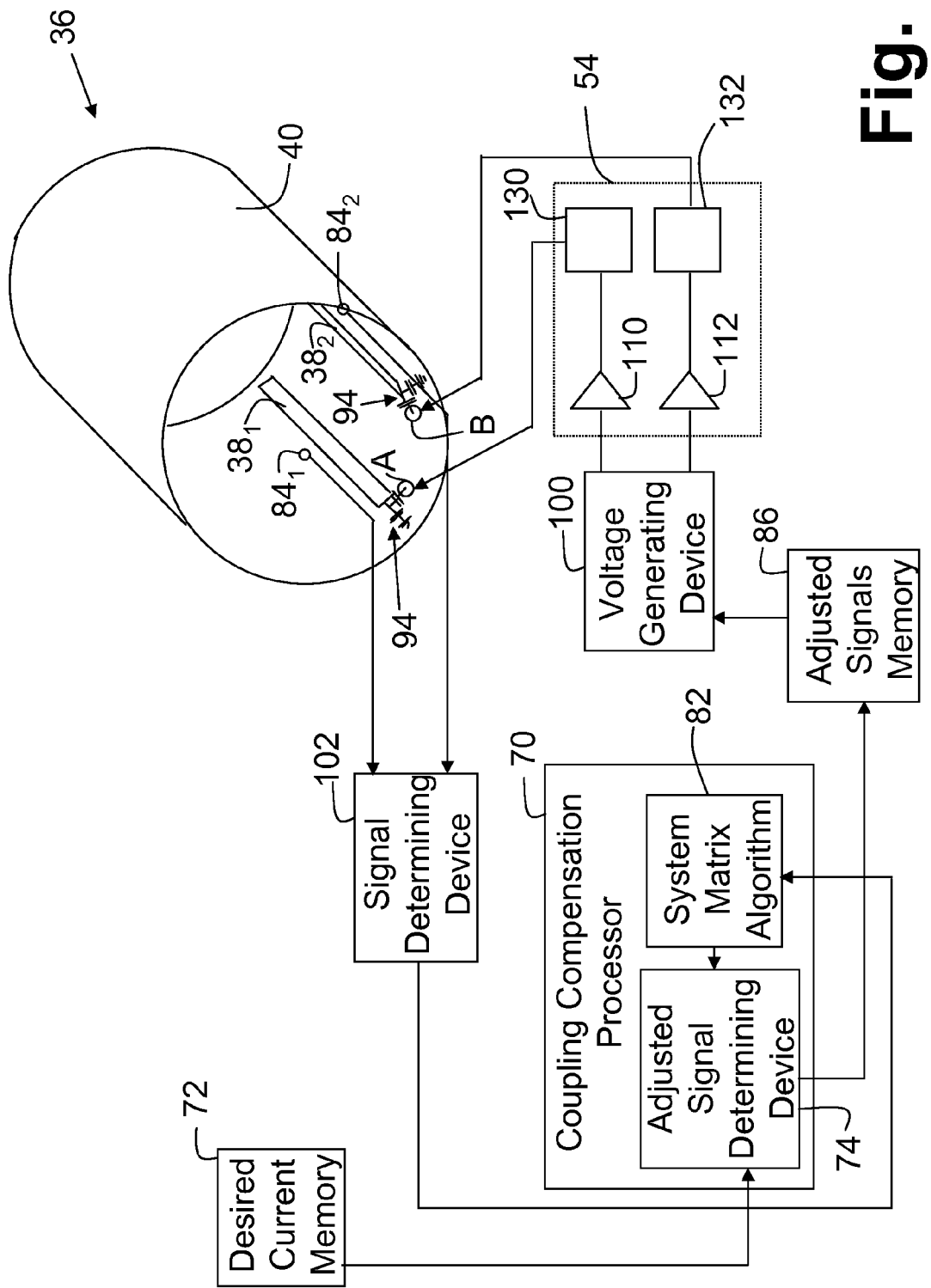
Figure 3:
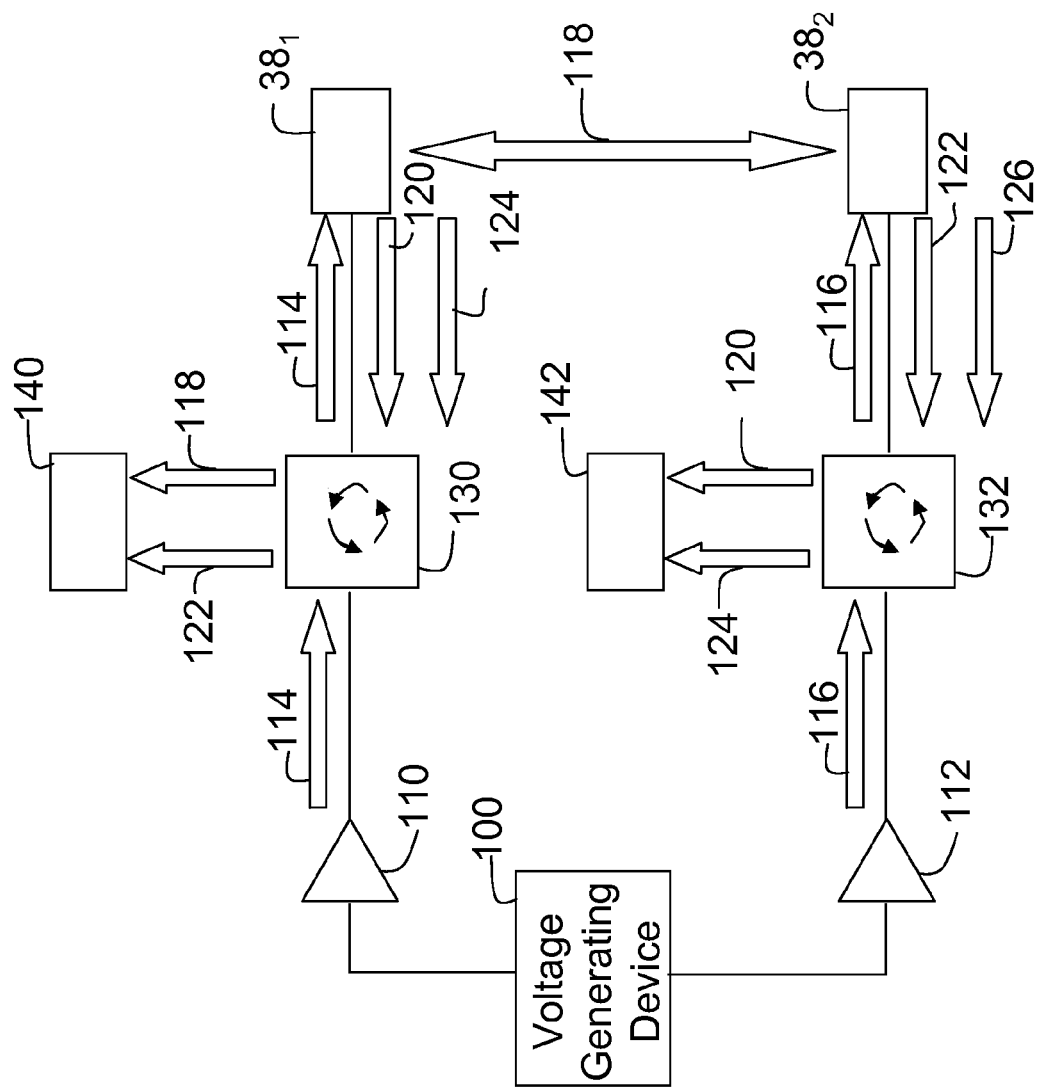

FIG. 1 diagrammatically shows a magnetic resonance imaging system;

FIG. 2 diagrammatically shows a detailed portion of the magnetic resonance imaging system; and FIG. 3 diagrammatically shows a power path in a portion of the magnetic resonance system.

With reference to FIG. 1, a magnetic resonance imaging scanner 10 includes a housing 12 defining an examination region 14, in which is disposed a patient or other imaging subject 16. A main magnet 20 disposed in the housing 12 generates a main magnetic field in the examination region 14. Typically, the main magnet 20 is a superconducting magnet surrounded by cryo shrouding 24; however, a resistive or permanent main magnet can also be used. Magnetic field gradient coils 30 are arranged in or on the housing 12 to superimpose selected magnetic field gradients on the main magnetic field within the examination region 14. An RF coil system or arrangement 36 with a surrounding shield 40 is disposed about the examination region 14. The coil system 36 includes a plurality of radio frequency coil elements or segments or coils or rungs 38 which each might have a different size and position. The coil system 36 may be a TEM coil, a hybrid TEM-birdcage coil, a birdcage resonator, an arrangement of loop resonators, or the like. In the exemplary embodiment, the coil system 36 includes a plurality of resonators 38 positioned around or in the intended volume of examination.

The coil system 36 is, for example, circularly cylindrical, but, of course, might have other geometries, such as an elliptic cross-section, semi-circular cross-section, semi-elliptical cross-section, and the like.

With continuing reference to FIG. 1, a magnetic resonance imaging controller 50 operates magnetic field gradient controllers 52 coupled to the gradient coils 30 to superimpose selected magnetic field gradients on the main magnetic field in the examination region 14, and also operates radio frequency transmitters 54 each coupled to an individual radio frequency coil segment 38 to inject selected radio frequency excitation pulses at about the magnetic resonance frequency into the examination region 14 for imaging. The radio frequency transmitter or transmitters 54 are individually controlled and can have different phases and amplitudes. The radio frequency excitation pulses excite magnetic resonance signals in the imaging subject 16 that are spatially encoded by the selected magnetic field gradients. Still further, the imaging controller 50 operates radio frequency receiver or receivers 56 that each is individually controlled and connected with the individual coil segment 38 of the coil system 36 to demodulate the generated and spatially encoded magnetic resonance signals. The received spatially encoded magnetic resonance data is stored in a magnetic resonance or MR data memory 60.

A reconstruction processor 62 reconstructs the stored magnetic resonance data into a reconstructed image of the imaging subject 16 or a selected portion thereof lying within the examination region 14. The reconstruction processor 62 employs a Fourier transform reconstruction technique or other suitable reconstruction technique that comports with the spatial encoding used in the data acquisition. The reconstructed image is stored in an image memory 64, and can be displayed on a user interface 66, transmitted over a local area network or the Internet, printed by a printer, or otherwise utilized. In the illustrated embodiment, the user interface 66 also enables a radiologist or other user to interface with the imaging controller 50 to select, modify, or execute imaging sequences. In other embodiments, separate user interfaces are provided for operating the scanner 10 and for displaying or otherwise manipulating the reconstructed images.

The described magnetic resonance imaging system 10 is an illustrative example. In general, substantially any magnetic resonance imaging scanner can incorporate the disclosed radio frequency coils. For example, the scanner can be an open magnet scanner, a vertical bore scanner, a low-field scanner, a high-field scanner, or so forth. In the embodiment of FIG. 1, the coil system 36 is used for both transmit and receive phases of the magnetic resonance sequence; however, in other embodiments separate transmit and receive coils may be provided, one or both of which may incorporate one or more of the radio frequency coil designs and design approaches disclosed herein.

With continuing reference to FIG. 1 and further reference to FIG. 2, a coupling compensation processor 70 determines adjusted input signals $U_{adj}$ which are actually applied to the transmitters 54 to achieve a desired resulting resonator current I, which is determined, for example, in advance and stored in a desired current memory 72. Because the individual coil segments or resonators 38 couple, the signal applied to on element during imaging makes a contribution to the remainder of the elements. Thus, the currents in the elements differ from the desired current distribution because of the mutual coupling. An adjusted signal determining device 74 determines the adjusted input signals $U_{adj}$ (amplitude and phase) for each segment 38 that will result in each segment actually carrying the desired current I.

More specifically, during a measurement procedure, a system matrix determining means or algorithm or process 82 determines or measures a transform matrix G and a system matrix T, which is an inverse of the transform matrix G, and defines a mutual contribution of each coil element for a given frequency. The transform matrix G can be determined by applying a preselected nominal transmit signal individually to each resonator $38_1$, $38_2$, ... and measuring the inductive coupling to each of the other resonators, e.g. by measuring the induced current or signal amplitude and phase in each of the other resonators.

$$[I_M]=[G][U], \text{ where} \qquad \text{Equation (1)}$$

$I_M$ represents the measured current;

U represents input signals, and

G denotes the transform matrix.

It is possible to calculate the resulting current $I_M$ by measuring the forward or reflected power. Alternatively, the magnetic field $B_1$ could be measured directly using selective magnetic field $B_1$ sensors or pick up coils $84_1$, $84_2$, ... to measure the currents induced in each corresponding coil element or resonator which provides a signal proportional to the existing field.

On the software side, the determination of the system matrix T is implemented in a preparation phase and prior to imaging.

The adjusted signal determining device 74 determines the adjusted input signals $U_{adj}$ for the transmitters 54 by using a multiplication of the system matrix T, which is an inverse of the transform matrix G, and the desired signals at the transmit side:

$$[U_{adj}]=[T][I], \text{ where} \qquad \text{Equation (2)}$$

T denotes the system matrix;

$U_{adj}$ are the resulting signals at the transmit side;

I are the desired currents in each transmitter channel or coil.

The determined adjusted signals are stored in an adjusted signals memory 86.

In the ideal case of a completely decoupled transmitter array, the system matrix T has only diagonal elements unequal to zero. In fact, in the majority of cases, the off-diagonal elements of the transform matrix G include nonzero values, which have to be compensated. Therefore, the matrix has to be determined.

With continuing reference to FIG. 2, an exemplary two channel TEM resonator includes first and second resonators $38_1$, $38_2$. Each resonator $38_1$, $38_2$ is connected to the RF-shield 40 with capacitors 94 and includes a corresponding attaching point or port A, B. A voltage or signal generating processor or device or means 100 causes the RF transmitter 54 to generate a signal of a predetermined value, which is applied in a sequential manner to a corresponding port A, B of each resonator $38_1$, $38_2$. For example, initially, the signal generating processor 100 generates a signal, which is applied to the port A of the first resonator $38_1$. Because of mutual coupling between the first and second resonators $38_1$, $38_2$, current flows not only in the first resonator $38_1$, but also in the second resonator $38_2$. A signal determining device or processor or means 102 determines an amount and/or phase of current which flows in each of the resonators, e.g. with corresponding pick up coils $84_1$, $84_2$. Next, the signal generating processor 100 generates a signal, which is applied to the input port B of the second resonator $38_2$. The signal determining device 102 determines an amount and/or phase of current which flows in each resonator $38_1$, $38_2$, e.g. with the corresponding first and second pick up coils $84_1$, $84_2$. Using the measurement results, the transform matrix G is determined and stored. Using the inverse of the transform matrix G, the proper input signals [$U_{adj}$] can be calculated for the desired currents [I]. Although, in the example above, the resulting transform matrix G is a 2×2 matrix, which corresponds to two resonators, it is contemplated that the coil system 36 will typically include a larger number of resonators, e.g. 8, 16 or 32.

In another embodiment, tune coils are disposed about the examination region 14 for transmitting predefined radio frequency signals to the pick up coils. A number of the tune coils, for example, is equal to the number of the pick up coils 84 which are used for receiving the predefined radio frequency signals.

With continuing reference to FIG. 2 and further reference to FIG. 3, in case of a strong mutual coupling, a non-negligible amount of power can be exchanged among amplifiers 110, 112 of the transmitter 54. For example, a forward power 114, 116 is supplied from the corresponding amplifiers 110, 112 to the first and second coil segments or resonators $38_1$, $38_2$. A coupling power 118 is established between the first and second coil segments $38_1$, $38_2$. As a result, coupled power 120, 122, in addition to reflected power 124, 126, flows back from the coils $38_1$, $38_2$ to the corresponding amplifiers 110, 112. The amplifiers 110, 112 typically include a turn off switch which turns the amplifiers 110, 112 off when the nominal power rating is exceeded, e.g. for excessive current, such as when too much power is reflected, or if too much power is coupled from another channel. To prevent the shutting down of the amplifiers 110, 112, circulators 130, 132 are used to overcome the tripping of the turn off switch. The circulators 130, 132 are connected between corresponding amplifiers 110, 112 and the coil segments $38_1$, $38_2$ to redirect the coupled power 120, 122 and the reflected power 124, 126 to corresponding load 140, 142. The forward power 114, 116 of the amplifiers 110, 112 passes the circulators 130, 132 and reaches the coil elements $38_1$, $38_2$ substantially unchanged, while the reflected power 120, 122 and the coupled power 124, 126 are directed to the load 140, 142. In the case of non-linear input impedance of the power amplifiers at the output port, the non-linear impedance is transformed into the resonators by mutual coupling, which is undesirable. The circulators prevent any coupling between the nonlinear input impedance and the resonator.

In the manner described above, the coupling properties of the transmitter array are determined in advance by a measurement. The applied signal by each transmitter channel during imaging is adjusted to cancel or supplement the induced signals, which other amplifiers and resonators cause such that the resulting current in the resonator is the intended signal. The method is applicable for MR systems, which operate in a narrow band frequency and includes a multi-channel RF transmit capability and the associated applications using coil arrays. The method relieves the stringent design requirements for the multi-channel RF transmit and/or receive coil arrays compensating for effects of dielectric resonances.

Of course, it is also contemplated that in the likewise manner the correction can be applied to the receive signals, for example, in the reconstruction process. In one embodiment, the separate transmit and receive coils are provided, the receive side system matrix T' can be calculated or derived from the system matrix T by an impedance transformation for use in correcting the receive signals.

In one embodiment, the coil arrangement 36 includes the coil elements 38 which each is characterized by two different frequencies. The system matrix T is determined in the manner described above for each individual frequency. The coupling compensation processor 70 corrects the input signal for each individual frequency.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A magnetic resonance imaging system, comprising:
    a voltage generating device for generating a preselected nominal transmit signal sequentially to each n individual coils segments of a coil arrangement;
    a transmitting system, which crates RF pulses in accordance with the preselected nominal transmit signal and transmits the RF pulses to each coil segment sequentially;
    a signal determining device for determining amplitude and phase of an induced magnetic coupling signal in each non-transmitting coil segments, the induced magnetic coupling signal corresponding to one of the transmitted RF pulse in accordance with the preselected nominal transmit signal; and
    a coupling compensation processor for determining an adjusted input signal for each of the coil segments in a digital domain, the adjusted input signal corrects for the induced magnetic coupling signal based on the induced magnetic coupling signal.

2. The system as set forth in claim 1, wherein the coupling compensation processor further includes:
    a system matrix determining algorithm for determining a system matrix, each element of the determined system matrix is representative of one of the preselected nominal transmit signal and induced magnetic coupling signal.

3. The system as set forth in claim 2, wherein an adjusted signal determining device included in the coupling compensation processor determines the adjusted input signal for each coil segment by:

$$[U_{adj}]=[T][I],$$

where,
    T denotes is the determined system matrix;
    $U_{adj}$ denotes the adjusted input signals; and
    I denotes the desired currents.

4. The system as set forth in claim 1, wherein the coil arrangement includes a plurality of resonators disposed circumferentially around an examination region.

5. The system as set forth in claim 1, wherein each segment of the coil arrangement is driven independently via a channel of the transmitting system to selectively apply RF pulses to an examination region.

6. The system as set forth in claim 1, wherein each segment of the coil arrangement is an independent receiving element which is connected to a channel of a receiver to demodulate received MR signals.

7. The system as set forth in claim 1, wherein the coil arrangement includes a TEM coil which includes a plurality of resonators extending parallel to a main magnetic field.

8. The system as set forth in claim 1, wherein the transmitting system creates RF pulses in accordance with the adjusted input signals and transmits the RF pulses to corresponding coil segments such that the transmitted RF pulses corrects for coupling between the coil segments.

9. A method of magnetic resonance imaging comprising:
determining a desired current for each of n individual coil segments of a coil arrangement, which coil segments are electromagnetically coupled to each other;
determining an adjusted input signal for application to each segment, which application results in each segment carrying the desired current after coupling, to compensate for coupling between the coil segments in a digital domain; the step of determining adjusted input signals including:
prior to the magnetic resonance imaging, generating signals of a predefined value;
creating RF pulses in accordance with the generated predefined signals;
transmitting the RF pulses sequentially to each of the n coil segments inducing currents in other individual coil segments; and
determining signal corresponding to the induced current in each coil segment;
creating RF pulses in accordance with the determined adjusted input signals; and
transmitting the RF pulses to corresponding coil segments.

10. The method as set forth in claim 9, wherein the step of determining adjusted input signals further includes:
determining a system matrix, each element of which is representative of one of the predefined signal and determined induced signal; and
multiplying the system matrix by a vector representing the desired currents of each coil segment.

11. A magnetic resonance scanner for performing the steps of claim 9.

12. A magnetic resonance method comprising:
applying a predefined RF signal individually to each of a plurality of electromagnetically coupled coil elements;
measuring induced signals which correspond to currents induced in the coil elements by the predefined signal; and
generating a system matrix, which describes a relationship between the applied predefined signal and the measured induced signals;
determining desired RF currents to be applied to each coil element to excite and manipulated magnetic resonance;
adjusting the desired currents in accordance with the system matrix to compensate for coupling between the coil segments in the digital domain.

13. The method as set forth in claim 12, further including:
receiving resonance signals induced by the applied currents; and
adjusting the received resonance signals in accordance with the system matrix to compensate for coupling between the coil segments in the digital domain.

14. The method as set forth in claim 13, wherein the adjusting step includes:
multiplying the received resonance signals by a transform of the system matrix.

15. The method as set forth in claim 12, wherein the predefined RF signal is applied to each of a plurality of resonators and the induced signals are measured using pick up coils separate from the resonators.

16. A magnetic resonance scanner for performing the steps of claim 12.

17. A magnetic resonance apparatus comprising:
a main magnet, which generates a main field through an examination region;
an RF coil system including an array of parallel coil segments;
a voltage generating device generating a preselected nominal transmit signal to induce electromagnetic coupling among coil segments and causing a transmitter to apply preselected nominal transmit signal individually to each coil segment;
a signal determining device which determines a function of a current induced in each coil segment in response to each applied preselected nominal transmit signal;
a coupling compensation processor which generates an adjusted signal to correct for the induced electromagnetic coupling;
an RF transmitter which transmits the adjusted signal; and
an RF receiver which receives resonance signals from the examination region.

18. The apparatus as set forth in claim 17, wherein the coupling compensation processor includes:
a system matrix calculator, which determines a matrix, which describes a relationship between the applied preselected nominal transmit signal and induced currents.

19. The apparatus as set forth in claim 18, further including:
an MRI controller which determines desired current pulses to be applied by the RF transmitter during a magnetic resonance procedure; and
a processor which operates in accordance with the system matrix on one of the received resonance signals and the desired RF current pulses to generate input pulses which compensate for the coupling between the coil segments.

* * * * *